(12) United States Patent
Bevan

(10) Patent No.: US 10,185,694 B2
(45) Date of Patent: Jan. 22, 2019

(54) MANUFACTURING METHODS FOR PRINTED CIRCUIT BOARDS

(71) Applicant: Heba Bevan, Bromley (GB)

(72) Inventor: Heba Bevan, Bromley (GB)

(*) Notice: Subject to any disclaimer, the term of this patent is extended or adjusted under 35 U.S.C. 154(b) by 83 days.

(21) Appl. No.: 15/314,764

(22) PCT Filed: May 26, 2015

(86) PCT No.: PCT/GB2015/051526
§ 371 (c)(1),
(2) Date: Nov. 29, 2016

(87) PCT Pub. No.: WO2015/181533
PCT Pub. Date: Dec. 3, 2015

(65) Prior Publication Data
US 2017/0199836 A1    Jul. 13, 2017

(30) Foreign Application Priority Data
May 30, 2014   (GB) .................................. 1409650.7

(51) Int. Cl.
G06F 13/40    (2006.01)
G06F 9/445    (2018.01)
(Continued)

(52) U.S. Cl.
CPC .......... *G06F 13/4081* (2013.01); *G06F 1/184* (2013.01); *G06F 9/44505* (2013.01);
(Continued)

(58) Field of Classification Search
None
See application file for complete search history.

(56) References Cited

U.S. PATENT DOCUMENTS 4,926,546 A * 5/1990 Polczynski .......... H05K 3/0097
174/250
6,989,589 B2 * 1/2006 Hammadou ...... H01L 27/11803
257/258

(Continued)

OTHER PUBLICATIONS

'Depanelizers for PCB Separation' by FKN Systek, archived from fknsystek.com on Feb. 28, 2014.*

(Continued)

*Primary Examiner* — Steven G Snyder
(74) *Attorney, Agent, or Firm* — Renner Otto Boisselle & Sklar, LLP

(57) ABSTRACT

We describe a method of manufacturing a plurality of electronic devices. The method comprises manufacturing a multi-device motherboard bearing programmable device circuit boards, each of these with an electronic device comprising a processor and programmable memory and being detachable from the motherboard except for one of more frangible links, at least one of these links comprising a programming connection. A device programming region bears a motherboard processor and program memory for programming the device circuit boards. Code for at least one application program for said electronic device is stored in said motherboard program memory. A user interface for the multi-device motherboard allows a user to configure each of the electronic devices to perform a defined function.

18 Claims, 11 Drawing Sheets

(51) Int. Cl.
*G06F 1/18* (2006.01)
*G11C 5/02* (2006.01)

(52) U.S. Cl.
CPC .............. *G11C 5/025* (2013.01); *Y02D 10/14* (2018.01); *Y02D 10/151* (2018.01)

(56) References Cited

U.S. PATENT DOCUMENTS

| | | | |
|---|---|---|---|
| 7,072,825 B2 * | 7/2006 | Wang | G06F 11/261 703/21 |
| 7,131,800 B2 * | 11/2006 | Anderson | H05K 3/0052 409/132 |
| 7,155,711 B2 * | 12/2006 | Vogel | G06F 17/5054 717/169 |
| 7,304,500 B2 * | 12/2007 | Chen | G06F 17/5054 326/37 |
| 7,346,784 B1 * | 3/2008 | Theron | G01B 31/318516 713/300 |
| 8,254,134 B2 * | 8/2012 | Hiew | H01L 21/565 235/492 |
| 8,527,949 B1 | 9/2013 | Pleis | |
| 8,553,427 B2 * | 10/2013 | Liu | G06F 1/184 361/760 |
| 9,451,691 B2 * | 9/2016 | Kim | H05K 1/0268 |
| 9,842,563 B2 * | 12/2017 | Russell | G09G 5/003 |
| 9,941,220 B2 * | 4/2018 | Hsu | H01L 23/562 |
| 2002/0070753 A1 * | 6/2002 | Vogel | G06F 17/5054 326/37 |
| 2002/0199142 A1 | 12/2002 | Gefen | |
| 2004/0254779 A1 * | 12/2004 | Wang | G06F 11/261 703/27 |
| 2005/0017315 A1 * | 1/2005 | Hammadou | H01L 27/11803 257/431 |
| 2005/0100421 A1 * | 5/2005 | Anderson | H05K 3/0052 409/132 |
| 2005/0144584 A1 * | 6/2005 | Chen | G06F 17/5054 716/117 |
| 2006/0015313 A1 * | 1/2006 | Wang | G06F 17/5027 703/14 |
| 2006/0081971 A1 * | 4/2006 | Shau | G01R 31/2856 257/690 |
| 2007/0204086 A1 | 8/2007 | Jaroszewski | |
| 2008/0286990 A1 * | 11/2008 | Hiew | H01L 21/565 439/55 |
| 2009/0223435 A1 * | 9/2009 | Fan | H05K 1/0266 116/240 |
| 2010/0110647 A1 * | 5/2010 | Hiew | H01L 21/565 361/752 |
| 2012/0212921 A1 * | 8/2012 | Liu | G06F 1/184 361/803 |
| 2012/0247811 A1 * | 10/2012 | Lin | H05K 1/118 174/251 |
| 2014/0263585 A1 * | 9/2014 | Sweere | H01L 24/17 228/180.22 |
| 2017/0025085 A1 * | 1/2017 | Russell | G06F 1/1652 |
| 2017/0179044 A1 * | 6/2017 | Hsu | H01L 23/544 |

OTHER PUBLICATIONS

'PCB VCut Scoring Machines—Quick-Score and Multi-Score' by Seetrax, archived from seetrax.com on Oct. 21, 2013.*
'PCB Designers Need to Know These Panelization Guidelines' by Jack Lucas, Dec. 15, 2015.*
'PCB Pallets—Arrays' by Advanced Circuits, archived from 4pcb.com on Mar. 28, 2014.*
International Search Report and Written Opinion for corresponding International Application No. PCT/GB2015/051526 dated Jan. 25, 2016.

* cited by examiner

MANUFACTURING METHODS FOR PRINTED CIRCUIT BOARDS

FIELD OF THE INVENTION

This invention relates to methods of manufacturing electronic devices, in particular wireless sensors, to devices manufactured by such methods, and to motherboards for use in such methods.

BACKGROUND TO THE INVENTION

There is a general need in the field of civil engineering to instrument structures such as roads, bridges, tunnels and the like with sensors such as wireless sensors, to monitor movement/integrity of the structure. This facilitates, among other things, efficient maintenance and improved safety. It is helpful if such a sensor has wireless communications; it may be battery powered or powered solely by, or supplemented by, energy harvesting. However it is also desirable to be able to achieve a long battery life, although the RF environment is often challenging, with poor signal propagation. Current devices are physically large, with a typical dimension of order 10 cm, and have a limited battery life, for example of order 2-3 months. Considerable improvement is possible by judicious selection of RF frequency (for example 400-900 Mghz is helpful), and selective sensor activation, providing sleep and deep-sleep modes. The use of low power processor technology, such as that available from ARM Ltd (UK) can also help to reduce power consumption. However even when all of these techniques are combined significantly losses still remain, with surprising origins.

The use of miniature, low power technology to instrument civil engineering structures brings other difficulties: it is generally desirable to provide a large number of sensors so that a structure can be closely monitored and relative motion of various parts of the structure identified for assessments/action. This often entails programming individual sensors in different ways—some may sense motion, some temperature, some humidity, some a combination of all three. These different types of sensors may be arranged over the structure in an optimum manner so that, for example, readings from different sensors may be interpolated/extrapolated. Such an approach generally entails programming different sensors with different software, depending upon the measurement made. However programming each individual sensor may take a significant amount of time, for example of order half an hour (depending upon various factors). When instrumenting a structure with a large number of sensors this programming time constitutes a significant practical problem.

New techniques have therefore been developed to address these difficulties. Although they are particularly useful when instrumenting a structure with sensors, the techniques we describe are not limited to such applications and, potentially, have more general value.

SUMMARY OF THE INVENTION

According a first aspect of the invention there is therefore provided a method of manufacturing a plurality of electronic devices, the method comprising: manufacturing a multi-device motherboard, the multi-device motherboard comprising: a plurality of programmable device circuit boards, each of said device circuit boards bearing an electronic device comprising at least a device processor and programmable, non-volatile device memory for storing code for controlling the device processor, and a device programming region, wherein each of the device circuit boards is detachable from the remainder of the motherboard except for one of more frangible links, at least one of said frangible links comprising a programming connection to the programmable circuit board; wherein the device programming region and device circuit boards are all part of the same circuit board, and wherein the device programming region bears a motherboard processor and motherboard program memory storing processor control code for controlling the motherboard processor to program the device circuit boards; storing code for at least one application program for said electronic device in said motherboard program memory; providing a user interface for said multi-device motherboard, wherein said user interface comprises a physical interface for an external computer system and a software user interface, wherein said software user interface is arranged to enable a user to configure each of said electronic devices to perform a defined function, wherein configuration of a said electronic device comprises providing software to said device memory of said electronic device, said software comprising code from said at least one application program such that a user-defined application is enabled to run on said electronic device to perform said user-defined function; using said user interface to configure said electronic devices on said motherboard; and detaching said configured electronic devices for use.

Surprisingly, when every aspect of a device is considered with the aim of reducing power, one of the significant overheads which remains is that of providing an external, standard device programming interface. Embodiments of the method described above enable a very lightweight programming interface to be employed, for example comprising a simple serial data connection to the device processor. This is because the device programming function is effectively distributed between a circuit board to be programmed and the motherboard processor, which can in effect be a dedicated processor for the set of devices. This in turn facilitates achieving a low power consumption for an electronic device fabricated by the method, as well as other advantages such as reduced physical weight.

In embodiments the motherboard processor provides a programming interface for the user, for example enabling selective programming of different devices with different application software. In embodiments this motherboard processor (and its associated circuitry) becomes redundant after the electronic devices have been configured and detached from the motherboard.

Furthermore, in embodiments of the method a batch of the electronic devices can be programmed in parallel and then detached, one by one, from the board as needed. For example one row of devices may be configured as temperature sensors, another as humidity sensors, and so forth; or all the devices on the board may be configured to perform the same, selected function. The motherboard processor enables a user to configure each device on the motherboard to perform a particular, selected function, in embodiments selected from amongst a set of functions for which code is stored locally to the motherboard processor, for example in non-volatile memory. In embodiments the programmable memory of an electronic device is essentially empty, a 'blank page' (apart, potentially, from some small amount of code to enable the actual programming—although this may be on-board on the processor). In embodiments the motherboard processor downloads application program software to an electronic device to configure the device to perform a particular function. Depending on the complexity of the device the application program software may be downloaded in combination with operating system software for the device, to provide standard low level interfaces, for example for a radio transmitter/transceiver, a network connection and the like. In some embodiments the code stored in association with the motherboard processor is source code, and this is compiled by the motherboard processor to perform the user-selected function, and then the compiled code is programmed into a device. Additionally or alternatively, however, a device may be configured by writing general-purpose or multi-purpose software into the device, and then configuring this software by writing data into one or more function-defining fields within the non-volatile memory of the device. In still other approaches, rather than compiling code to perform a defined function the motherboard processor may select application code from code for a set of different application programs, each for performing, a different, defined function.

In some preferred embodiments, once the device has been programmed it is tested by the motherboard processor. When the device is detached from the motherboard, by breaking the one or more frangible links (which provide power and programming data to a device), it is provided with a housing and/or encapsulated (after inserting a battery, if necessary). In sensor embodiments of the devices the programmed code may include code to delay the sensor operation after application of power to the device. This is helpful during installation as it provides time for the sensor to be installed and thus does not generate spurious false readings which might otherwise confuse a network of sensors already in place. Such an approach can also facilitate automatically determining an alignment/orientation to a sensor.

In preferred implementations the device circuit boards are part of the same board (PCB—printed circuit board) as the motherboard, for example in the form of a PCB array, but are detachable for example by a frangible link such as a tab or scribe line. However the invention also provides a method of manufacturing a plurality of electronic devices according to the invention as described above, where the device circuit boards are not all part of the same circuit board as the motherboard and wherein the frangible links instead comprise separable electrical connections, for example so that the electronic (sensor) devices comprise separate daughter boards mounted on top of the motherboard. A similar modification may be made to the related aspect of the invention described below.

According to a related aspect of the invention there is provided a method of fabricating a plurality of sensor devices, the method comprising: fabricating a motherboard comprising a first, PCB (printed circuit board) array region and a second, device programming region, wherein said PCB array region comprises an array of individual device PCBs each with a layout for a sensor device, each having a frangible link to the motherboard such that said device PCBs and said device programming region form a panel; fabricating sensor devices on said individual device PCBs and a programming device on said programming region; operating said programming device whilst on said panel to program said sensor devices whilst said sensor devices are on said panel; and removing said sensor devices from said panel.

In embodiments each of the individual device PCBs is connected within the motherboard panel by one or more breakable tabs carrying power and, in embodiments, a serial programming line and optionally a clock. (Alternatively in these and the previously described embodiments a device may be programmable wirelessly). As previously described, in preferred embodiments the programming device provides a user interface for selecting functions to be performed by the sensor devices, so that different devices on the panel may be programmed with different software to perform different sensing functions.

Such a panel of sensor devices programmed in this manner may be used to instrument a structure by, first, programming a batch or (preferably) all of the devices on the panel, then detaching a device, optionally encapsulating or housing the device, and then mounting a device on the structure as needed.

In some preferred approaches the above described device (sensor) circuit boards are efficiently manufactured in quantity by fastening a case around a device whilst it is still on the motherboard. The act of fastening the case over the device breaks the frangible link(s) and in embodiment at the same time seals the device within the case. Thus particularly with sensor devices the case may form a substantially waterproof seal around the device, which may be essentially self-contained—that is, it may have an RF link, and be powered by a battery mounted on the device board.

In some preferred embodiments one or both parts of the case carries one or more blades, to cut/break the frangible link(s). In embodiments a blade projects from one part of the case or housing, for example an upper part, and is received by a recess in a second part of the case or housing, for example a lower part. The blade may be of electrically conducting or non-conducting material. The frangible link typically has two or more electrically conducting tracks providing a programming interface for the device. Part of the frangible link may remain trapped between the mating parts of the case/housing and therefore, where the blade is electrically conductive, the programming interface may be deactivated (for example set to 0s) so that it is not damaged by being shorted by the blade.

In embodiments the case may be fastened shut by magnetic attraction. This provides a very quick and simple method of completing manufacture of a device. Thus each portion of the case/housing may have a one or more magnets which are brought adjacent to one another when the case/housing is closed around the device. In some preferred embodiments the blade is magnetic and a second magnet is provided at the base of the recess into which the blade fits. Very strong magnets are available but optionally one or more additional fastenings may also be provided to hold the parts of the case/housing together after closing, such as one or more screws.

Thus in a related aspect the invention provides a method of fabricating an electronic device, the method comprising: fabricating a motherboard comprising an array of said electronic devices each on a respective region of the motherboard isolated from the motherboard except for one or more frangible links; and detaching a device from said motherboard by fastening a case around the device such that edges of the case cut said one or more frangible links.

The skilled person will appreciate that features of the previously described aspects and embodiments of the invention may also be incorporated in this aspect of the invention.

In a further related aspect the invention provides a multi-device motherboard/panel comprising a plurality of fabricated electronic devices each on a substantially separate PCB of an array region of the panel, and a device programming region comprising a processor, stored control code, and device program code, for programming the device to operate.

According to a further aspect of the invention there is therefore provided a method of programming a plurality of electronic devices, the method comprising: providing a motherboard comprising a first, PCB (printed circuit board)

array region, wherein said PCB array region defines an array of individual device PCBs each for an electronic device, each having a frangible link to the motherboard; providing a plurality of electronic devices on said individual device PCBs; providing a programming system for said programming region; operating said programming system to program said electronic devices, whilst said electronic devices are on said motherboard, with one or more of: operating system software, application software, and configuration data for the devices; and removing said electronic devices from said motherboard.

In embodiments the devices are each configured for a different end user whilst still on the motherboard. In some at least some of the electronic devices comprise the same type of device—for example the same make and/or model of consumer electronic device. Then the programming may comprise programming different devices or groups of devices with different configuration data for different, individual end users, all whilst the devices are on the motherboard.

Additionally or alternatively at least some the electronic devices may comprise different types of electronic device. Then the programming may comprise programming the different types of electronic device or groups of the different types of device with different operating system software and/or different application software, in particular to perform substantially the same function (for example email, word processing) on the different types of device. Optionally this may include configuring the different application software with configuration data for a common user or common owner of the (different types of) devices—for example different devices may be set up to use the same corporate email system.

In embodiments the method further comprises providing the motherboard with a second, device programming region where the programming system is at least partly located (in embodiments, fabricated), in particular such that the device PCBs and the device programming region together form a PCB panel. In embodiments the electronic devices are provided on the panel by fabricating them on the device PCBs, in situ.

The invention also provides an electronic device manufactured by a method as described above. Such a device is distinguishable, for example, by the remains of a frangible link (as described above) on the device's circuit board. More particularly, however, the device may be fastened within a housing or case as previously described.

Thus in a further aspect the invention provides an electronic device in a two-part housing, the housing having upper and lower portions fitting around a board carrying the device and having mating edges, wherein at least one of the mating edges of said upper and lower portions of the housing has a blade, and wherein said board has a frangible link trapped and cut by said blade between said mating edges of said portions of the housing.

In embodiments the frangible link carries a programming connection for the device; such a programming connection may comprise a set of conductive tracks on a narrow isthmus of (printed circuit) board extending from the device. In embodiments the blade is magnetically actuated; for example the mating edges of the housing portions may each bear respective mating magnets, one of which may define the blade. Preferably, the programming connection is deactivated, and is thus not affected by shorting by the blade.

BRIEF DESCRIPTION OF THE DRAWINGS

These, and other aspects of the invention, will now be described, by way of further example, with reference to the accompanying figures which are as follows.

DETAILED DESCRIPTION OF PREFERRED EMBODIMENTS

Figure 1:
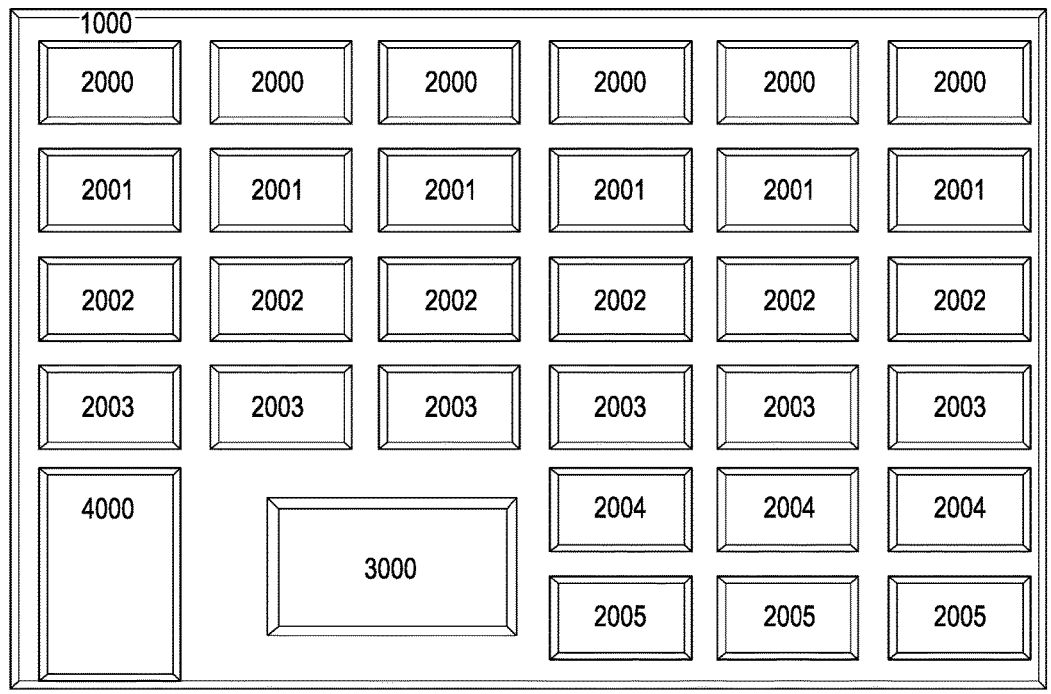
FIG. 1: Main board (panel) embodiment.

FIG. 1 illustrates manufacturing of a main board/panel or motherboard 1000. In embodiments this contains a variety of sensor devices (200x→(2001, 2002, 2003, 2004, 2005)), a programmable sensor connector platform and base station transceiver 3000, a backup board 4000, and provision for connected devices. Connected devices may include: camera, screen, storage, NAND/NOR/SPI flash, DDR DRAM interface, Ethernet, memory stick, mouse, LAND, WiFi, Bluetooth, headphone, speakers, keyboard (wired and wireless), USB mini.

In one example the sizes of the boards are as follows:
Typically, the main board (1000) is the size of a laptop or A4-size paper, but it may be manufactured in any size.
The sensor devices (2000) may be designed to be all the same size or different sizes as needed, however in this example they are roughly (3.5 cm×2.4 cm×0.5 cm)
The programmable sensor connector platform and base station transceiver (3000), is approximately (15 cm×2.4 cm×0.5 cm)
The backup board (4000) is approximately (15 cm×2.4 cm×0.5 cm)

Figure 2:
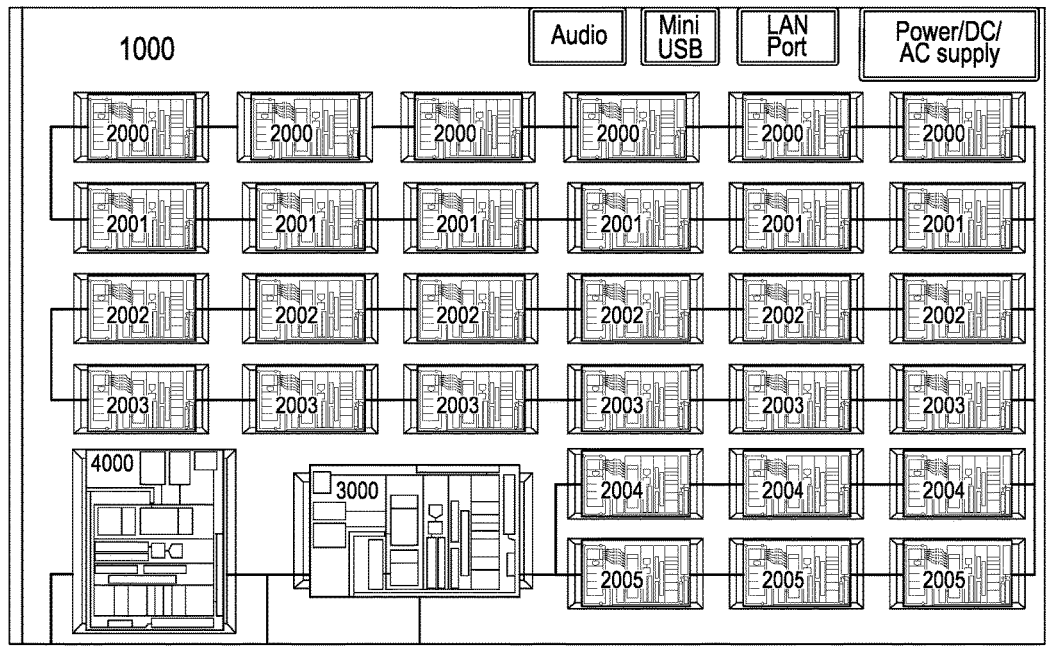
FIG. 2: Functional block diagram of main board.

FIG. 2 shows connections of the main board 1000, in one embodiment. The main board 1000 interfaces may include a mini USB, LAN port and a power supply connection. FIG. 2 also shows linked connections between the main board 1000, sensor devices (200x→(2001, 2002, 2003, 2004, 2005)), programmable sensor connector platform, the base station transceiver (3000) and backup board (4000).

Figure 3:
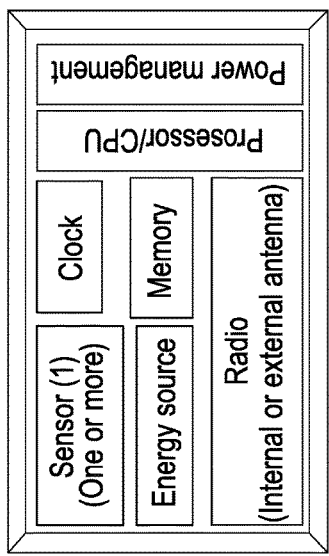
FIG. 3: Sensor board 2000/200x layout.

FIG. 3 shows an embodiment of a sensor device board 200x (2000, 2001, 2002, 2003, 2004, and so forth). Board 200x typically contains a sensor 201x (light 2010, temperature 2011, humidity 2012, accelerometer 2013, acoustic 2014, pressure 2015, infrared 2015, motion 2016, strain 2017, and so forth). In many embodiments the sensor device board 200x comprises a processor 2200, a clock 2210, memory 2220, a power management system 2300, an energy (power) source 2400 and a radio (RF link) 2500 that may include an internal or external antenna. The sensor device board 200x may have more than one processor. The main board 1000 is connected to a power source, and the sensor device board 200x draws power from the main board 1000 while it is linked to the main board—the on-board power source does not need to be used until the device board 200x is snipped from the main board. Each device is weakly, ie detachably, linked to the board, for example by an isthmus carrying a set of tracks, allowing it to be separated to be used individually.

In embodiments there are three different layout embodiments of the sensor board 200x, where the positioning of the components may be arranged in three ways:

a—Sensor Board 200x, the components may be laid out vertically on a flat surface b—Sensor Board 200x, the components may be laid out horizontally (stacked up, this reduces the length of the connections between the components, increasing performance and lowering the power consumption)

c—Sensor Board 200x, The components may be laid out in a combination vertical and horizontal arrangements In addition, some or substantially all of the components can be integrated into one chip. This has the advantage of speeding up the data processing, increasing robustness, lowering the cost of the device and lowering the power consumption of the sensor board devices 200x.

The Sensor Board 200x can be programmed while connected to the main board. Each Sensor Board 200x is weakly (frangibly) linked via a wire connection to the main board 1000, allowing it to be separated to act individually. Once separated from the main board, the Sensor Board 200x can be programmed wirelessly.

The layout options for the board of FIG. 3 also apply for boards 3000, 4000 and for the main board 1000.

Figure 4:
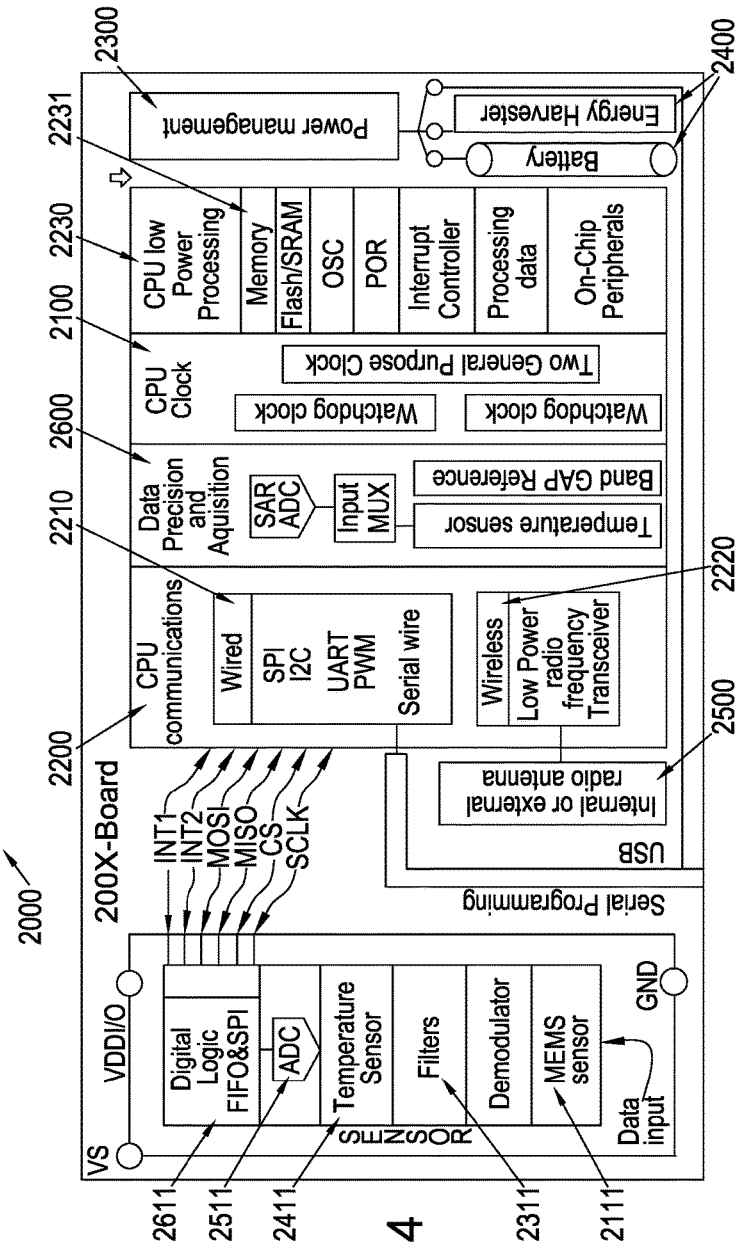
FIG. 4: Functional block diagram of sensor board 200x.

A functional block diagram of an embodiment of the sensor board 200x is illustrated in FIG. 4. It shows the sensor board 200x connections to components. The sensor devices 201x→(light 2010, temperature 2011, humidity 2012, accelerometer 2013, acoustic 2014, pressure 2015, infrared 2015, motion 2016, strain 2017, and so forth) are connected to the processor 2200. The processor 2200 is connected to clock 2210, memory 2220, a power management system 2300, an energy (power) source 2400 and a radio (RF link) 2500. Within the sensor 201x (which may have sensor(s) for light 2010, temperature 2011, humidity 2012, accelerometer 2013, acoustic 2014, pressure 2015, infrared 2015, motion 2016, strain 2017 and the like) in the embodiment FIG. 5, the sensors are formed from a MEMS (Micro-Electro Mechanical) Sensor 2111, a demodulator 2211, a filter 2311, a temperature sensor 2411, an ADC (Analogue to Digital Convertor) 2511, a digital Logic FIFO & SPI (First In, First Out & Serial Peripheral Interface) 2611.

When MEMS sensor 2111 senses a change of environment or of some physical quantity, it passes the information to the demodulator for processing and then to the filter to remove the noise. For robustness and information reliability, the temperature sensor 2411 inhibits temperature fluctuations from substantially affecting the readings of MEMS sensor 2111. The temperature sensor 2411 feeds the information to the ADC 2511 to convert analogue readings to digital signals. The ADC 2511 then passes the digital signals to digital logic 2611. The digital logic 2611 in turn transfers the readings through for example 6 pins, to the processor 2200. In embodiments the pins are INT1 (instance1), INT2 (instance2), CS (Chip Select), MOSI (Master Output, Slave Input), (MISO) Master Input, Slave Output and SCLK (Serial Clock).

The processor 2200 communicates through wired and wireless connections to its surroundings. The wired 2210 connection and the wireless 2220 connection provide all the links to the outside of the processor chip. The wired communication 2210 is constructed from an SPI bus (Serial Peripheral Interface), a I²C bus (Inter-Integrated Circuit), a UART bus (Universal Asynchronous Receiver/Transmitter), a PWM (Pulse-Width Modulation) and a SW bus (Serial Wire). Through the wired 2210 connection, the sensor board 200x can be programmed via a serial/USB link (Universal Serial Bus).

In embodiments processor 2200 has an data acquisition system, a wired data connection 2210 and a wireless data connection 2220. The wired data connection (in this and the later described boards) includes a serial programming connection, which in embodiments runs across the frangible link between boards and is used for programming the daisy chained boards. The data acquisition system has a bandgap voltage reference, which produces constant and steady voltage irrespective of temperature and power supply variations and file loading on the processor. The processor clock 2210 typically has a watchdog clock, a wake-up clock and one or more general-purpose clocks.

Within the functionality of low power processing circuitry 2230, processor memory 2231 comprising Flash and SRAM (Static random-access memory) is integrated with the circuit; it is also possible to add further memory to the Sensor board device 200x. In addition to the memory, the functionality of the low power processing circuitry 2230 includes an OSC (Oscillator Start-up Chip), a POR (Power On Reset) function, an Interrupt controller and on-chip peripherals.

Further, the sensor device 200x contains a power management system 2300, energy source 2400 (battery, energy harvester or combination of the two), and a radio 2500 with an internal or external antenna that is linked to the wireless part of the processor 2200. The sensor device 200x may have more than one of any of these components.

Figure 5:
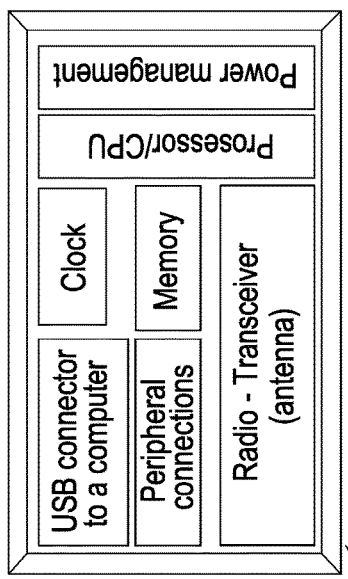
FIG. 5: The base station 3000.

FIG. 5 shows an embodiment of "base station" 3000, a board that contains the peripheral connections to the devices and to the transceiver base station. This board may be "snipped" (removed from the motherboard) and used later to change the programmes on the sensor board 200x. However preferably most of the configuration is done wirelessly after the initial programme is loaded to the back-up board 4000's individual CPUs.

The base station 3000 typically has one processor 2200, a clock 2210, memory 2220, a power management system 2300, an energy (power) source 2400 and a radio (RF link) 2500 that may include an internal or external antenna. However, the base station 3000 may have more than one of any of these components.

The Main Board 1000 provides power to the Base Station 3000 while they are connected to each other. The Base Station 3000 does not need to use its in-built energy source until the device is snipped from the main board 1000. Each device is weakly linked to the board, allowing it to be separated to act individually. The USB port can connect to a computer or data loader device to pass the data to and from the Base Station 3000 for data monitoring and collection.

Figure 6:
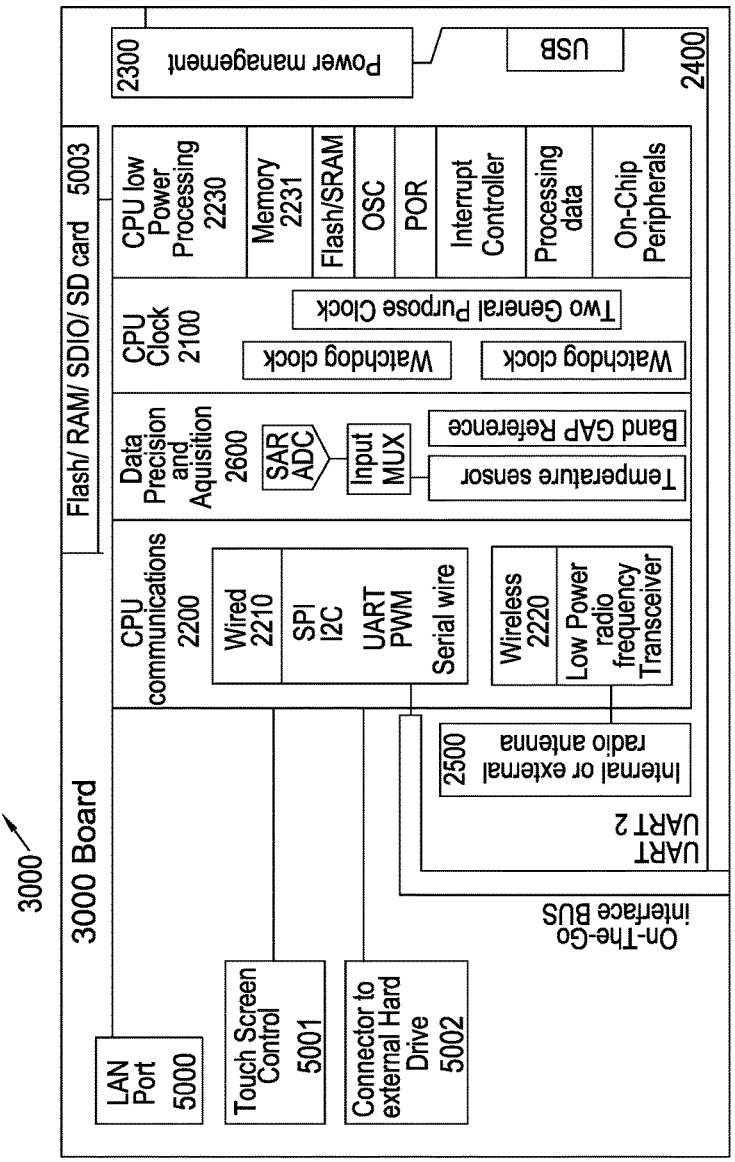
FIG. 6: Functional block diagram of board 3000.

The Functional Block Diagram Board 3000 in FIG. 6 illustrates that the Base Station 3000 has three main purposes:

1. Programming the sensor devices through a serial wire,
2. Loading the data to a data logger, server or computer,
3. Serving as a backup system board if the main board 1000 has more than one Base station 3000 within it. In this situation, the Base Station 3000 may replace the Backup board 4000.

The base station 3000 contains within it processor 2200. The processor 2200 communicates through wired and/or wireless connections to its surroundings (connected devices). The wired connection 2210 and the wireless connection 2220 provide links to the outside of the processor chip. The wired communication 2210 may comprise one or more of: an SPI bus (Serial Peripheral Interface), I²C bus (Inter-Integrated Circuit), UART bus (Universal Asynchronous Receiver/Transmitter), PWM (Pulse-Width Modulation) and a SW bus (Serial Wire). Through the wired communication, the sensor board 200x can be programmed via a serial/USB link (Universal Serial Bus).

The processor 2200 has an integrated data acquisition system, wired connection 2210 and wireless connection 2220. The data acquisition system has a bandgap voltage reference (a temperature independent voltage reference circuit). The bandgap reference produces a constant and steady voltage substantially irrespective of temperature and power supply variations and file loading on the processor. The processor clock 2210 typically has a watchdog clock, a wake-up clock and one or more general-purpose clocks.

Within the functionality of low power processing circuitry 2230, the processor memory 2220 is integrated with the circuit and uses Flash and SRAM (Static random-access memory), however it is also possible to add memory to the Sensor board device 200x. In addition to the memory, the functionality of the low power processing circuitry 2230 includes an OSC (Oscillator Start-up Chip), a POR (Power On Reset) circuit, an Interrupt controller and on-chip peripherals.

Further, the sensor device 200x contains a power management 2300 system, an energy source 2400 (battery, energy harvester or combination of two) and a radio 2500 with an internal or external antenna that is linked to the wireless part of processor 2200. The sensor device 200x may have more than one of any of these components.

The base station 3000 is preferably awake at all times, and should preferably have a strong signal and the capability of transmitting and receiving to the complete network (the sensor device 200x nodes). Preferably therefore the base station 3000 includes an external antenna and is typically powered by a wired power supply or an energy harvester rather than a battery. Optionally it may also have the capability of being powered by a battery if necessary.

The base station 3000 preferably has connectors for connecting to multiple devices—for example a camera, screen, storage, NAND/NOR/SPI flash, DDR DRAM interface, Ethernet, memory stick, mouse, LAND, Wi-Fi, Bluetooth, headphone, speakers, keyboard wired and wireless, external and internal additional memory (SDIO/SD card/Ram/Flash), minibus, and the like. However for simplicity the functional diagram of FIG. 6 shows only connections to a minibus 2400, a LAN port 5000, a screen 5001, hard drive 5002 and internal and external additional memory 5003 (SDIO/SD card/Ram/Flash).

Figure 7:
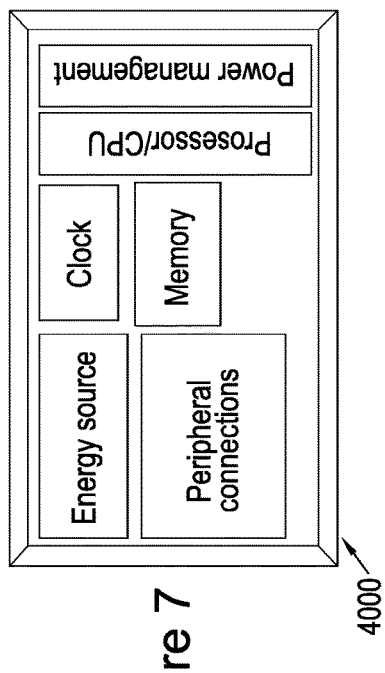
FIG. 7: Backup board 4000.

An embodiment of the Backup Board 4000 is shown in FIG. 7. The Main Board 1000 can include or omit the backup board 4000.

The backup board 4000 is a backup system that, in embodiments, has an additional CPU and memory that may store some or all programs for the sensor board 200x devices. The CPU and memory may later retrieve all of the programs for the 200x devices as needed.

Figure 8:
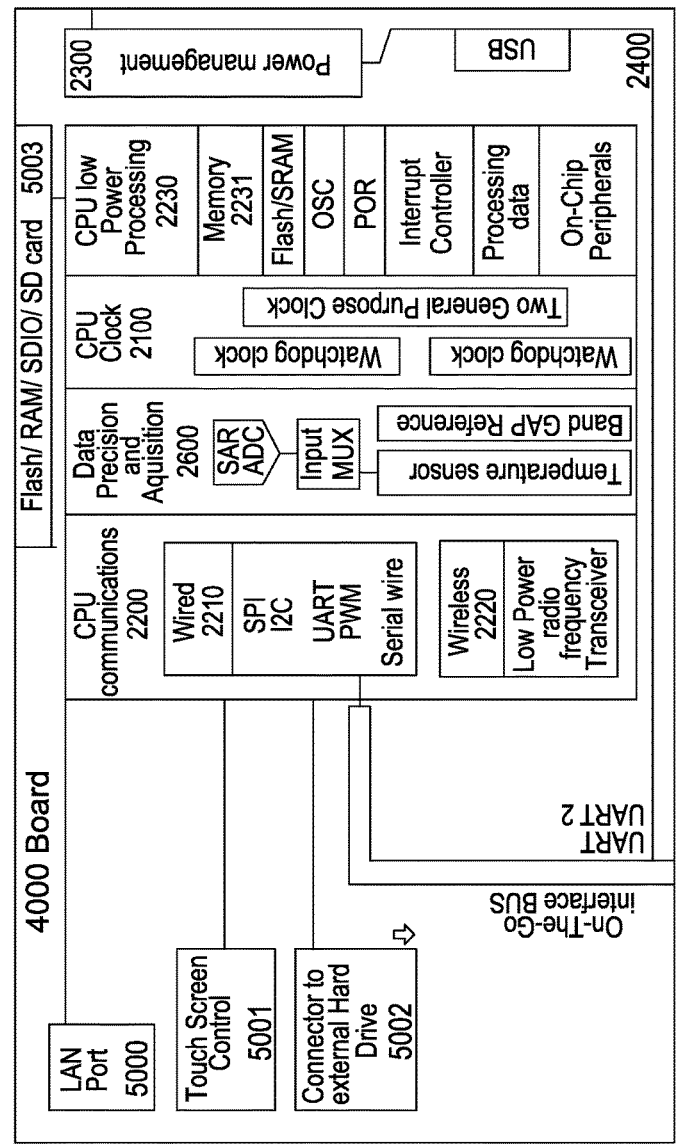
FIG. 8: Functional block diagram of board 4000
Figure 9:
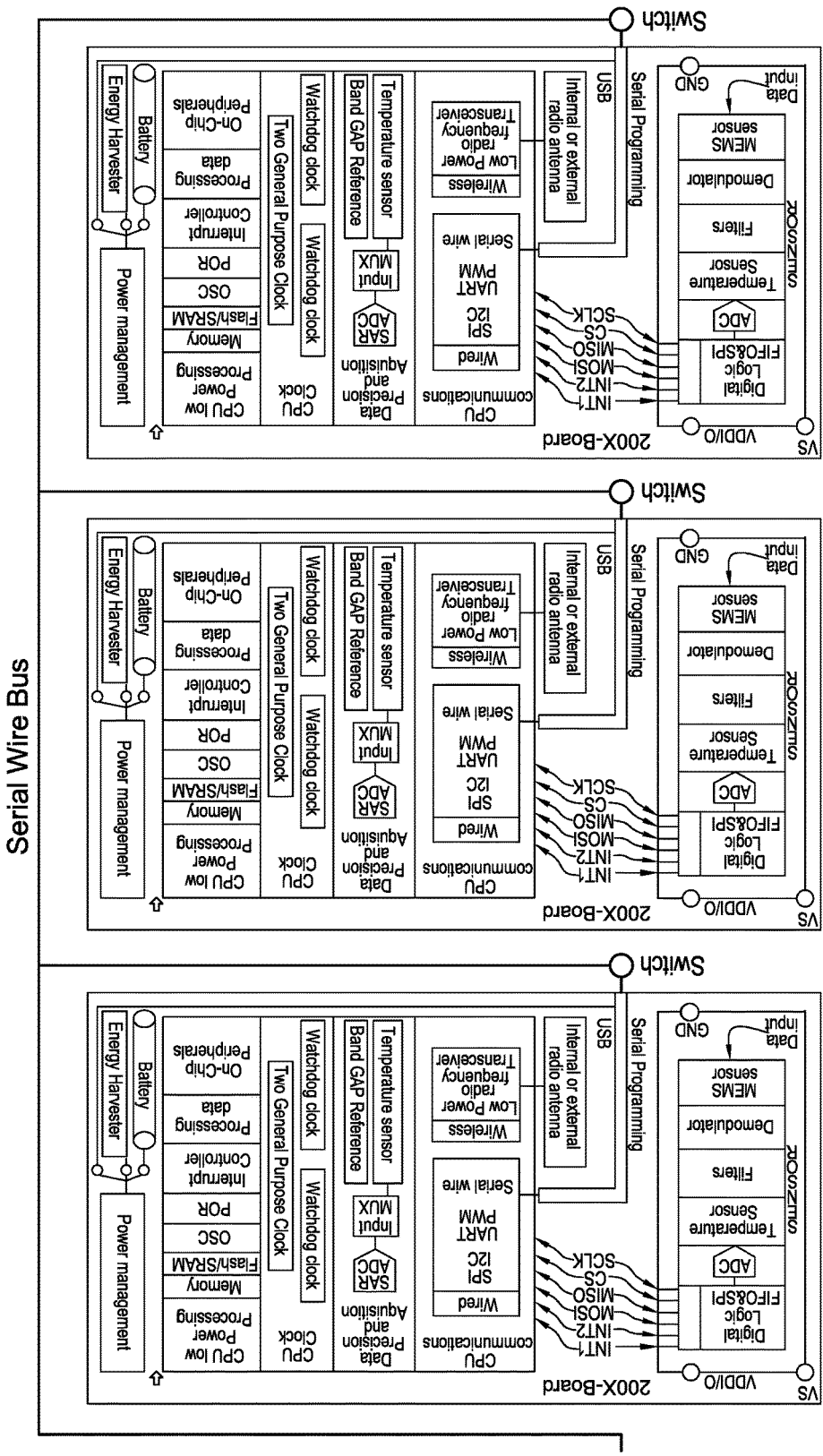
FIG. 9: Functional block diagram showing communication between 200x boards.

The functional block diagram of board 4000 in FIG. 8 illustrates that the backup board 4000 has two main purposes:
1. Serve as a Backup system. The Backup Board shown in FIG. 9 is not configured with a radio and antenna so it cannot be used as a base station. However the Backup Board 4000 can be used as a base station when it does include a radio and an antenna.
2. Programming the sensor devices through serial wire if the Base Station 3000 has been snipped off the Main Board 1000.

The backup board 4000 contains within it the processor 2200. The processor 2200 communicates through wired and wireless connections to its surroundings. The wired connection 2210 and the wireless connection 2220 provide links to the outside of the processor chip. The wired communication 2210 may comprise one or more of: an SPI bus (Serial Peripheral Interface), I²C bus (Inter-Integrated Circuit), UART bus (Universal Asynchronous Receiver/Transmitter), PWM (Pulse-Width Modulation) and SW bus (Serial Wire). Through the wired communication, the sensor board 200x can be programmed via, for example, a serial/USB link (Universal Serial Bus).

Preferably the processor 2200 has a data acquisition system (which may include an A/D converter), a wired connection 2210 and a wireless connection 2220. The data acquisition system may include a bandgap voltage reference. The processor clock 2210 typically has a watchdog clock, a wake-up clock and one or more general-purpose clocks.

Within the functionality of the low power processing 2230, the processor memory 2220 is integrated with the circuit using Flash and SRAM (Static random-access memory), however it is also possible to add memory to the Backup Board 4000. In addition to the memory, the functionality of the low power processing 2230 includes an OSC (Oscillator Start-up Chip), a POR (Power On Reset), an Interrupt controller and on-chip peripherals.

Further, the Backup Board 4000 contains power management 2300 and an energy source 2400 (battery, energy harvester or power supply or a combination of any or all these).

The Backup Board 4000 has connectors which may include connectors for: a camera, screen, storage, NAND/NOR/SPI flash, DDR DRAM interface, Ethernet, memory stick, mouse, LAND, Wi-Fi, Bluetooth, headphone, speakers, keyboard wired and wireless, external and internal additional memory (SDIO/SD card/Ram/Flash) and minibus. However, for simplicity the functional diagram FIG. 8 shows only minibus 2400, a LAN port 5000, a screen 5001, hard drive 5002 and internal and external additional memory 5003 (SDIO/SD card/Ram/Flash).

Figure 10:
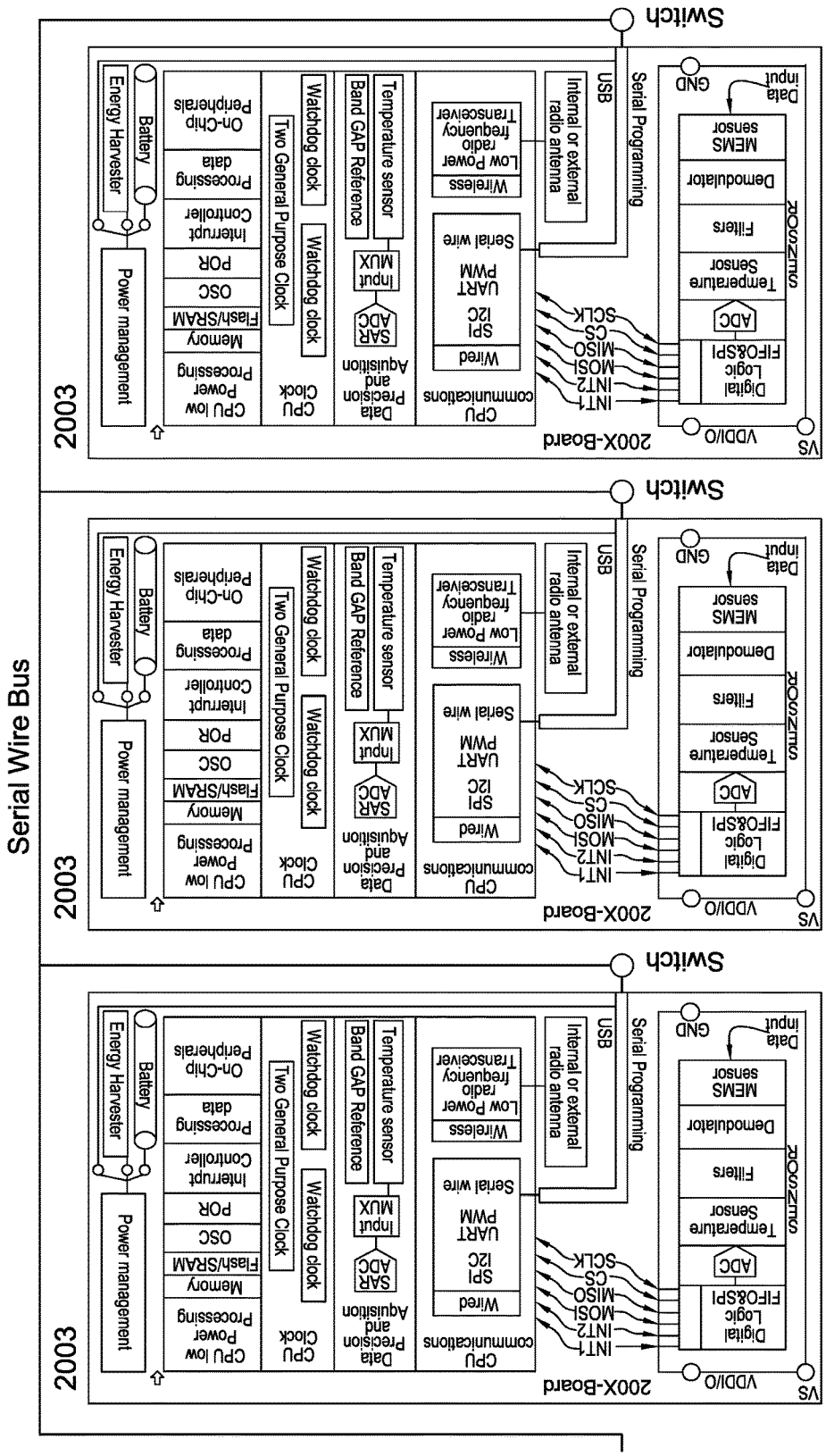
FIG. 10: Functional block diagram showing communication between and 2003 board and board 2003.

FIGS. 9 and 10 show functional diagrams illustrating the communication between sensor boards 200X. The 200x boards can be aligned vertically, horizontally or side by side. In embodiments they may be programmed in one or more of three ways:
1. In a first programming method, the Sensor Board 2003 is daisy chained to another sensor board 2003 via trace which is daisy chained to another sensor board 2003 via trace and so forth.
2003→2003-2003→ . . .
The steps to program the devices in this manner are as follow:
a. The communication through the sensor devices 2003 is through a serial wire. The switches between the sensors 2003 are open circuits (off mode) before beginning to program. The switches can be turned off and on from the software or hardware.
b. Program the first sensor 2003 device as a master in the following manner:
i. Directly link the mini-USB between the Main Board 1000 and a computer that has the software for programming. Next, flash the memory of the Sensor board 2003 to intialise its CPU with the load program.

ii. After programming, the first sensor board 2003 (the master) will switch-on the next sensor device 2003 (the slave) and program the second sensor device. The second device will then switch-on and program the third device in the chain and so on. This process can also be accomplished with the first sensor board (the master) programming all other sensor devices. During this process the sensor board 2003 does not need to be connected to a battery or energy harvester as it is getting the power it needs through a USB.

iii. As soon as the sensor devices 2003 are snipped off of the Main Board 1000, they can be connected to an energy source to activate.

iv. Note that this method can be done for several stacks of sensor devices at the same time.

2. A second programming method, partly illustrated in FIG. 11, connects the sensor board 2003 to a base station board 3000 that has been programmed through a mini-USB or JTAG (Joint Test Access Group) interface with one or more several programs for the various sensors devices 200x.

a. In this case all of the switches between the sensor devices are on (open circuit)

b. The process starts with the first row of sensor devices 2001 in FIG. 1. The first sensor device 2001 is initialised with the program that may or may not be different from the program used for the second row of sensor boards 2002 and program used by the third row of sensor boards 2003 and son on. Each row of sensor devices may have the same or different programs. With this programming method one can even load different operating systems for different devices at the same time.

3. A third programming method, partly illustrated in FIG. 11, connects the sensor board 2003 to the Backup Board 4000 when of the base station board 3000 has been snipped off of the main board 1000. The Backup Board 4000 has been programmed with the several programs for the various sensors devices 200x using a mini-USB or JTAG interface.

a. In this case all the switches between the sensor devices are on (open circuit)

b. The process starts with the first row of sensor boards 2001 in FIG. 1, initialising the first sensor device 2001 with a program that may or may not be unique from the program used in the sensor devices 2002 in the second row 2002 and the program used in the third row of sensor devices 2003 and so on. In this case, we can load even different operating systems for different devices at the same time.

In embodiments the sensor devices are linked to the base station by programmable board 3000 and/or backup board 4000. Communication is through a serial wire and base station 3000 or backup board 4000 act as a master.

Figure 11:
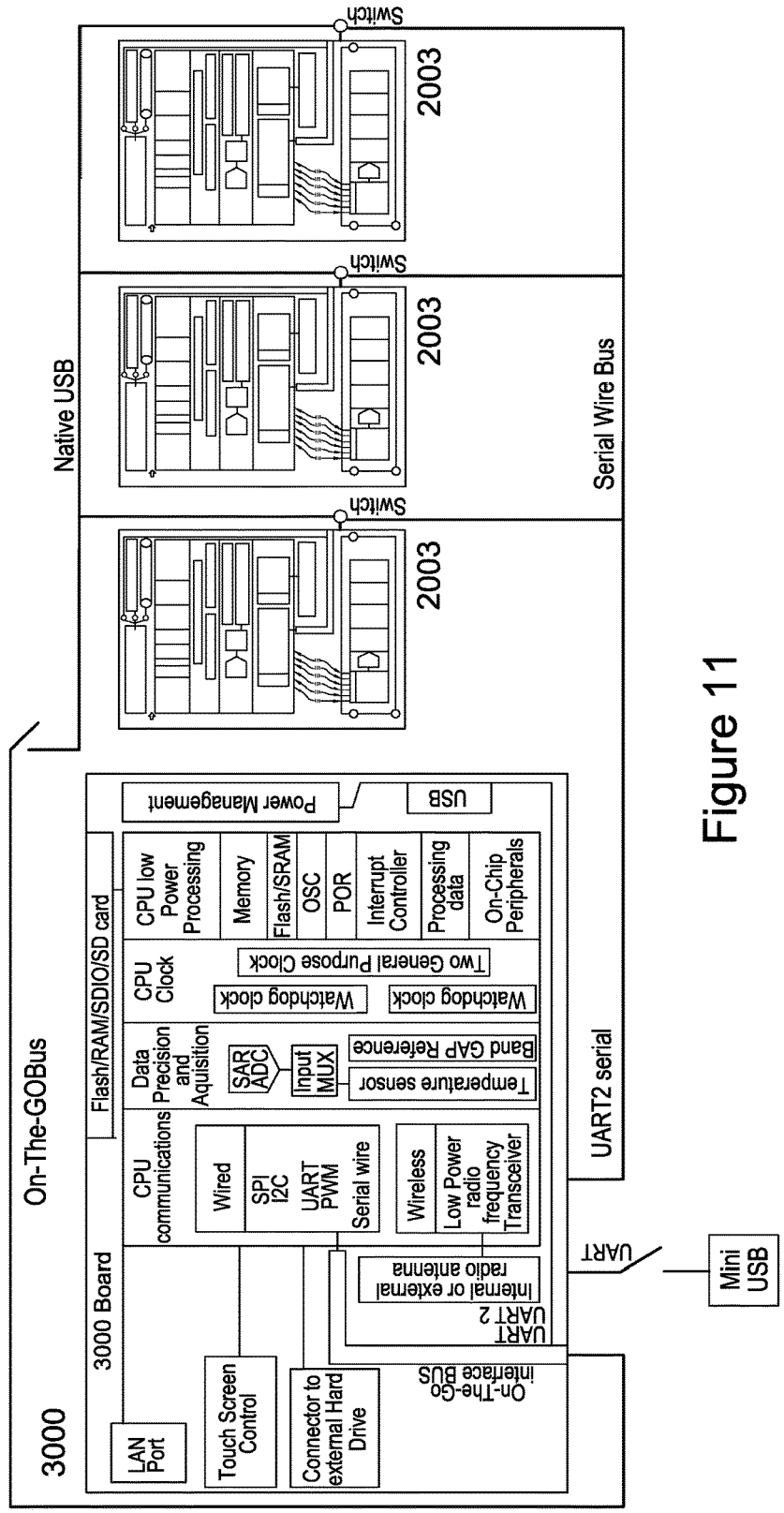
FIG. 11: Functional block diagram of communication between 3000/4000 and 200x boards.

FIG. 11 illustrates that the main board 1000, the base station 3000 and the back-up board 4000 have physical mini-USB connections through which they can load programs and program other devices.

Figure 12:
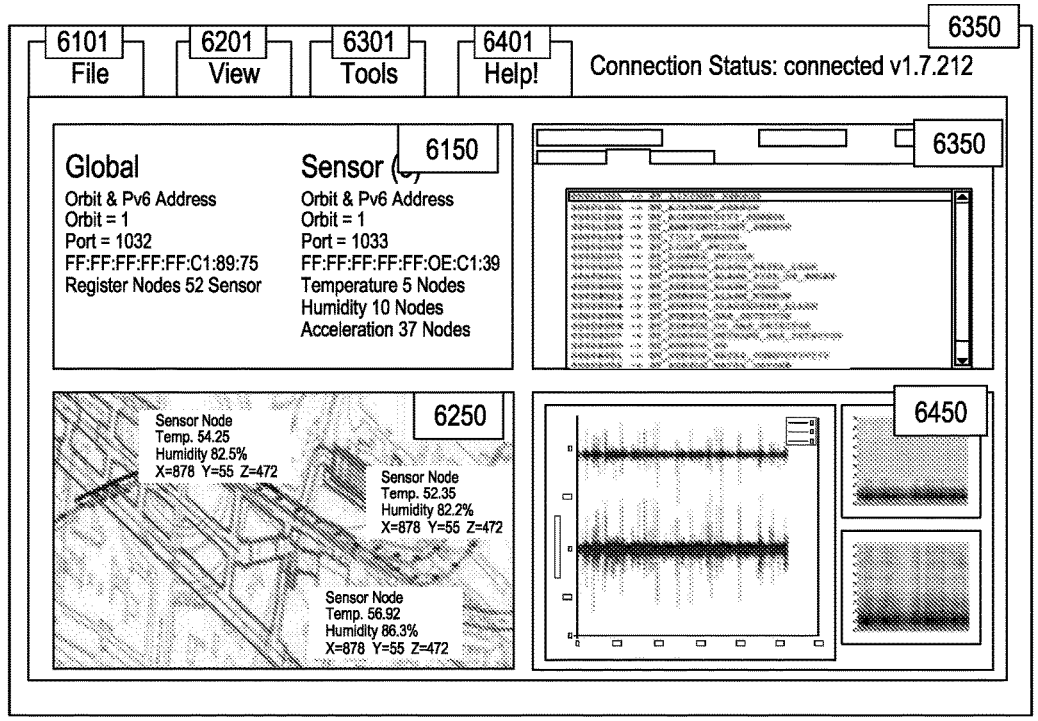
FIG. 12: Software graphical user interface.

FIG. 12 illustrates an embodiment of a software Graphical User Interface (GUI) 6000 for the system. In the upper left of the Software Graphical User Interface 6000 is the File Tab 6101. The File Tab 6101 has the functionality of selecting, opening, creating, saving, printing, connecting, loading, deleting, saving and closing individual files and projects in the software system. The functionality is accessed in the computer or Internet enabled device by clicking on the File Tab 6101 and selecting one of the sub-categories that appear in a drop-down menu.

The Open 6102 sub-category offers the options of accessing the sub-options Project 6103 or the File 6104. The Project 6103 sub-option allows the user to access particular work projects created in the software system. The Project 6103 sub-option accesses the compiled software for the Base Station 3000, the Backup Board 4000 and the variety of Sensor Boards 200x used in a particular work project. The File 6104 sub-option accesses individually compiled programs for a particular Base Station 3000, the Backup Board 4000 or Sensor Board 200x.

The New 6105 sub-category offers the sub-options of Project 6106 and File 6107. The Project 6106 sub-option allows the user to create a new project that will afterwards be accessible through the Project 6103 sub-option. The New File 6107 sub-option allows the user to create individually compiled programs for a particular Base Station 3000, the Backup Board 4000 or Sensor Board 200x that will afterwards be accessible through the File 6104 sub-option.

The Save 6108 sub-category offers the sub-options of Save Project 6109, Save File 6110, Save Graph 6111, Save Data 6112, Save Raw Data 6113 or Save Network Data 6114.

The Print 6115 sub-option offers the printing sub-options of Print Project 6116, Print File 6117, Print Graph 6118, Print Data 6119, Print Raw Data 6120 or Print Network Data 6121.

To connect to a particular board, the user will select the Connect 6122 sub-category and to choose one the three sub-options of Connect to Base Station Board 6123, Connect to Backup Board 6124 or Connect to The Sensor Board 6125.

The Load 6126 sub-category allows the user to load a project to a Main Board 1000 or Backup Board 4000 or to load a file to a Sensor Board 200x using, respectively, the sub-options Load Project to Base Station Board 6127, second Load Project to Backup Board 6128, Finally Load File to The Sensor Board.

The Remove 6129 sub-category provides the user with the sub-options Delete Project 6130 and Delete File 6131.

The Close 6132 sub-category provides the user with the sub-options of Save and Close Project 6133, Save and Close File 6134, Save All and Shut Down Program 6135.

In the upper left of the Software Graphical User Interface 6000 is the View Tab 6201. The View Tab 6201 has the functionality of selecting and opening information on the Main Board 1000, Sensor Boards 200x, Base Station 3000 and Backup Board 4000.

The View Tab 6201 allows users to view wireless sensor network project and file information. The functionality is accessed in the computer or Internet enabled device by clicking on the View Tab 6201 and selecting one of the sub-categories and sub-options that appear in a drop-down menu.

From the sub-category View Main Board 6202, users may choose the Power 6203. Using the Power 6203 sub-option, users may view the power consumption information of the Main Board 1000.

From the sub-category View Sensor Boards 6204, users may choose the Power 6205 and Network 6206 sub-options. Using the Power 6205 sub-option, users may view the power consumption information of the Sensor Boards 200x. Using the Network 6206 sub-option, users may view wireless sensor network information about the Sensor Boards 200x such as radio frequency, bandwidth use, register identification, orbit, channel use, bit rate, transmission rate and other information.

From the sub-category View Base Station 6207, users may choose the Power 6208 and Network 6209 sub-options. Using the Power 6208 sub-option, users may view the power consumption information of the Base Station 3000. Using the Network 6209 sub-option, users may view wireless sensor network information about the Base Station 3000 such as radio frequency bandwidth used, radio frequencies used, register identification, orbit, radio channel and frequency used, bit rate, transmission rate and other information.

From the sub-category View Backup Station 6209, users may choose the Power 6210 sub-option. Using the Power 6211 sub-option, users may view the power consumption information of the Backup Station 4000.

In the upper-right of the Software Graphical User Interface 6000 is the Tools Tab 6301. The Tools Tab 6301 has the functionality of initialising the Main Board 1000, Sensor Boards 200*x*, Base Station 3000 and Backup Board 4000, as well as configuring the Sensor Boards 200*x* and Base Station 3000. The functionality is accessed in the computer or Internet enabled device by clicking on the Tools Tab 6301 and selecting one of the sub-categories and sub-options that appear in a drop-down menu.

From the sub-category Initialisation 6302, users may configure the initialization of the Main Board 1000, the Sensor Boards 200*x* such as the type of sensor ((light 2010, temperature 2011, humidity 2012, accelerometer 2013, acoustic 2014, pressure 2015, infrared 2015, motion 2016, strain 2017, and the like), the Base Station 3000 and the Backup Board 4000. These are accomplished using, respectively, the Main Board 6303, Sensor Boards 6304, Base Station 6305 and Backup Board 6306 sub-options.

The Sensor Boards 200*x* and the Base Station 3000 are the wireless sensor network components that have radios. From the Configure Network 6307 sub-category, users may configure elements of the Sensor Boards 200*x* and Base Station 3000 such as radio frequency bandwidth use, register identification, orbit, channel use, bit rate and transmission rate.

In the lower-left quadrant of the Software Graphical User Interface 6000 is a Help Tab 6401. The Help Tab 6401 has the functionality of searching any query or information within the graphical interface.

In the embodiment of the Software Graphical User Interface 6000, FIG. 12, the File Window 6150 is located in the upper-left quadrant, the View Window 6250 is located in the lower-left quadrant, the Tools Window 6350 is located in the upper-right quadrant and the Help/Information Window 6450 is located in the lower-right quadrant.

The File Window 6150 displays all available actions under the File Tab 6101, including selecting, opening, creating, saving, printing, connecting, loading, deleting, saving and closing individual files and projects in the software system.

The View Window 6250 displays all available actions under the View Tab 6201, including selecting and opening information on the Main Board 1000, Sensor Boards 200*x*, Base Station 3000 and Backup Board 4000.

The Tools Window 6350 displays all available actions under the Tools Tab 6301, including initialising the Main Board 1000, Sensor Boards 200*x*, Base Station 3000 and Backup Board 4000, as well as configuring the Sensor Boards 200*x* and Base Station 3000.

The Help Window 6450 displays all available actions under the Help Tab 6401, including searching any query or information within the graphical interface.

In the embodiment of the Software Graphical User Interface 6000, FIG. 12, the Connection Status and Version Number Display 6500 is located at the top of the upper-right quadrant. The Connection Status and Version Number Display 6500 informs the user whether the interface is connected to the Main Board 1000, the Sensor Boards 200*x*, the Base Station 3000 and/or the Backup Board 4000, as well as the version number of the software.

Housing

Figure 14A:
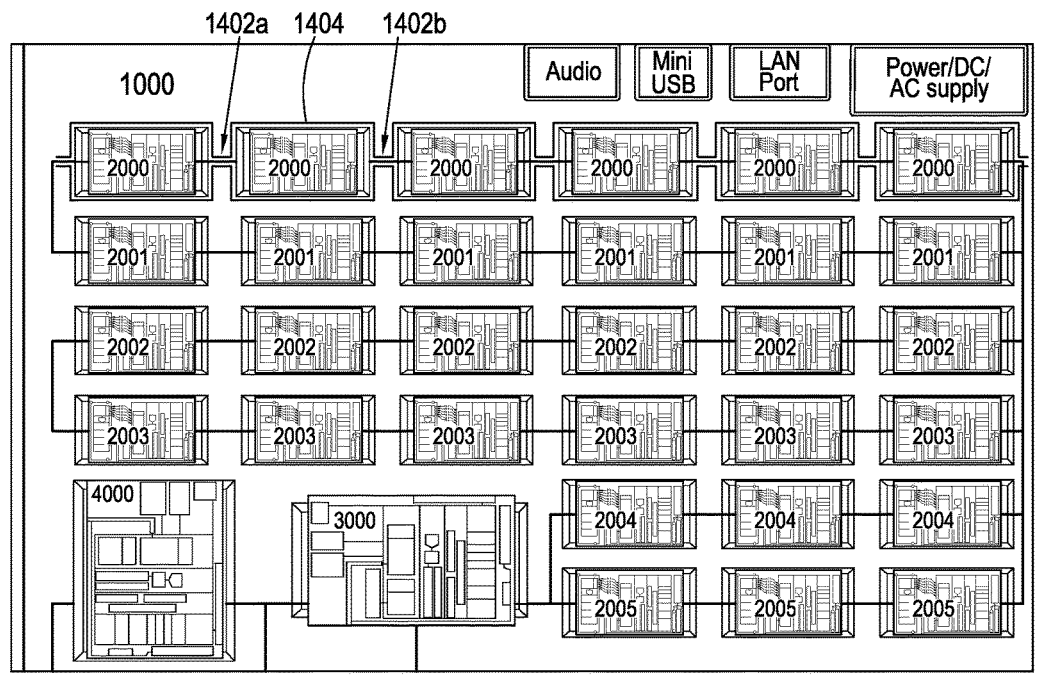
FIG. 14 Device boards with frangible connections to a motherboard.
Figure 14B:
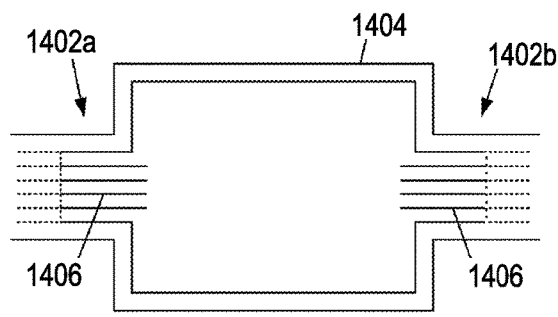
Figure 14C:
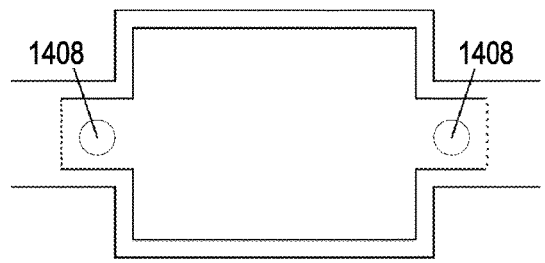

Referring now to FIG. 14, FIG. 14*a* shows a portion of the motherboard 1000 illustrating device boards 2000 each with two frangible links 1402*a,b* formed by an isthmus of board linking one board to another and, at each end, to the motherboard. Apart from these frangible connections, the boards are separated from the motherboard by a cut or channel 1404. FIG. 14*b* shows a device in more detail, illustrating that each link 1402 comprises a plurality of conductive tracks 1406 for programming the device. In a 2-wire embodiment these comprise a data line and a clock line; in a 4-wire embodiment these comprise DATA_IN, DATA_OUT, CLOCK, and RESET. As illustrated in FIG. 14*a*, in embodiments the devices are daisy-chained via these connections/programming interfaces. FIG. 14*c* illustrated that in embodiments one or more fastening holes may be provided in a device board; the interface tracks may be run around these.

Figure 15A:
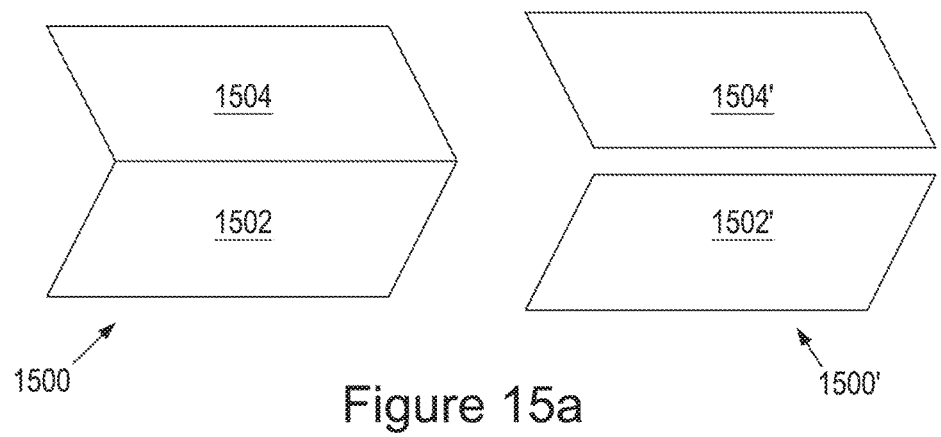
FIG. 15 Device housing embodiments.
Figure 15B:
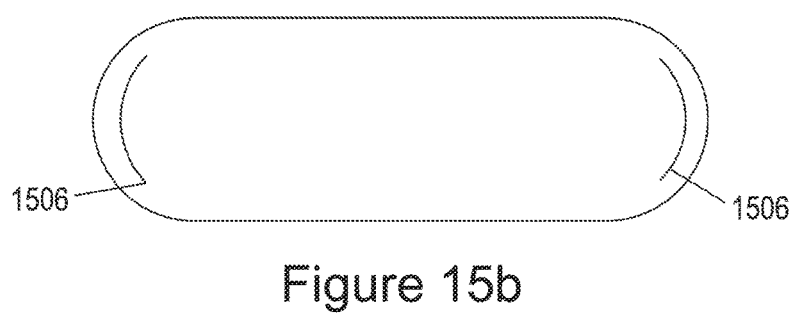
Figure 15C:
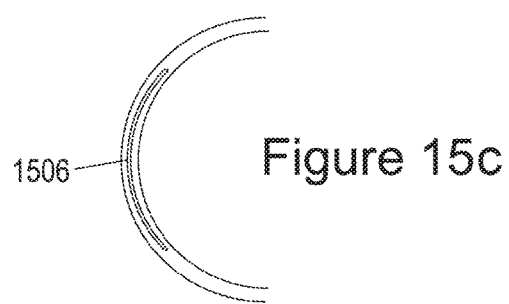
Figure 15D:
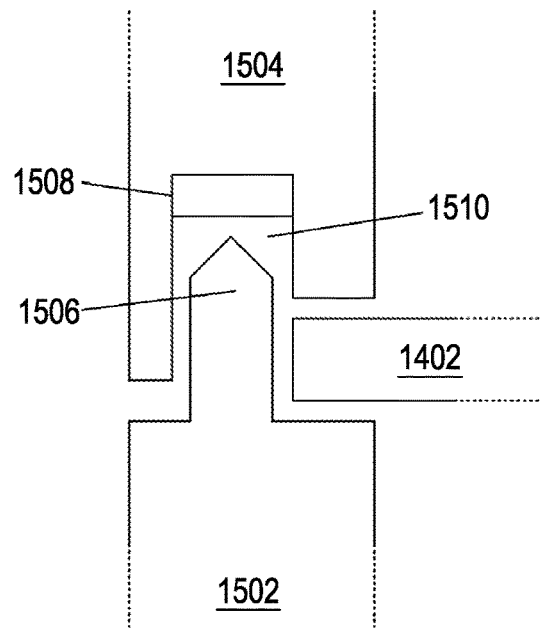
Figure 15E:
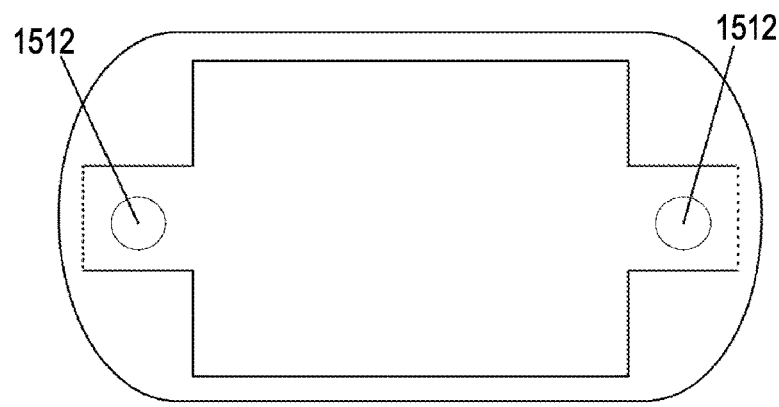

FIG. 15*a* shows a device housing 1500, 1500' prior to fastening around a device. In some embodiments housing 1500 comprises upper and lower portions 1502, 1504 hinged along one edge in a clamshell-type arrangement; in other embodiments the upper and lower portions 1502', 1504' of the housing 1500' are separate until fastened together. FIG. 15*b* shows a view from above of one of these housing portions bearing a blade 1506 at either end. FIG. 15*c* shows an enlargement of such a blade, viewed from above, and FIG. 15*d* shows a cross-sectional view through the housing when closed around a device. In FIGS. 15*b*, 15*c* and 15*d* the blade is curved, but it may alternatively be straight, as shown in FIG. 15*e*.

Referring to FIG. 15*d*, blade 1506 in one portion 1502 of the housing fits into a recess or step 1510 in the other 1504 portion of the housing. Blade 1506 is preferably magnetic and mates magnetically with a corresponding magnet 1508 in housing portion 1504. It is preferably but not essential to use strong magnets such as a rare earth magnet, for example a neodymium iron magnet, these can provide very high attractive forces. The isthmus 1402 of board 2000 is cut by the blade; the recess 1510 has a stepped edge to allow the housing edges to close against one another, making space for the thickness of the board trapped between the edges of the housing. The conductive tracks 1406 may be shorted by blade 1506, so preferably after programming voltages on these tracks are set to zero volts or the connections are left floating, for example by deactivating the programming interface. As shown in FIG. 15*e*, optionally the housing may be further held closed by fastenings 1512, such as screws or bolts.

In some preferred embodiments a device is sealed once within its housing. In embodiments a housing may be colour-coded according to a function of the device it contains, for example to simplify identification of the sensor type (temperature, humidity, displacement, tilt, acceleration, pressure and the like).

APPLICATIONS

We now describe some further example applications of embodiments of the invention.

Scenario 1:

Companies typically desire to achieve uniformity in the use of the same security software and/or the same email system and/or the same applications, and so forth for a particular type of technology they use. Frequently, however, the types or brands and versions of the technology used by employees of a company vary, potentially also using different operating systems. This makes programming the devices according to company and employee requirements time-consuming, as each device must be individually configured according to the operating system it uses.

Embodiments of the invention address this problem, as one can program the devices, sequentially or simultaneously, by type or brand and/or operating system, in each case allowing each device to download the software appropriate to its operating system, thereby achieving substantial software uniformity across different hardware devices. For example, on the Main Board 1000, the Boards 200x can be set out in rows according to sensor type, with each row being a different device type. The Backup Board 4000 instructs the Sensor Boards 200x either sequentially by row or all at once, to download software. The devices are programmed to download software compatible with their individual operating systems, thus saving time and achieving uniformity in the download of the same software across the rows of devices. Here the devices may comprise, for example, different main circuit boards of different consumer electronic devices such as mobile phones, or even laptops.

In this scenario, different pieces of the same type of technology are programmed with the same software and applications, but use they different operating systems. For example, one type or brand of mobile phones may use Mac OS™, another may use Android™, while still another may use WinC™. These devices are not configured in the same manner due to their differing operating systems, and the same versions of software and applications cannot be installed simultaneously on all of the devices. Instead, each device must be individually programmed with the particular version of software that is compatible with that particular operating system.

Figure 13:
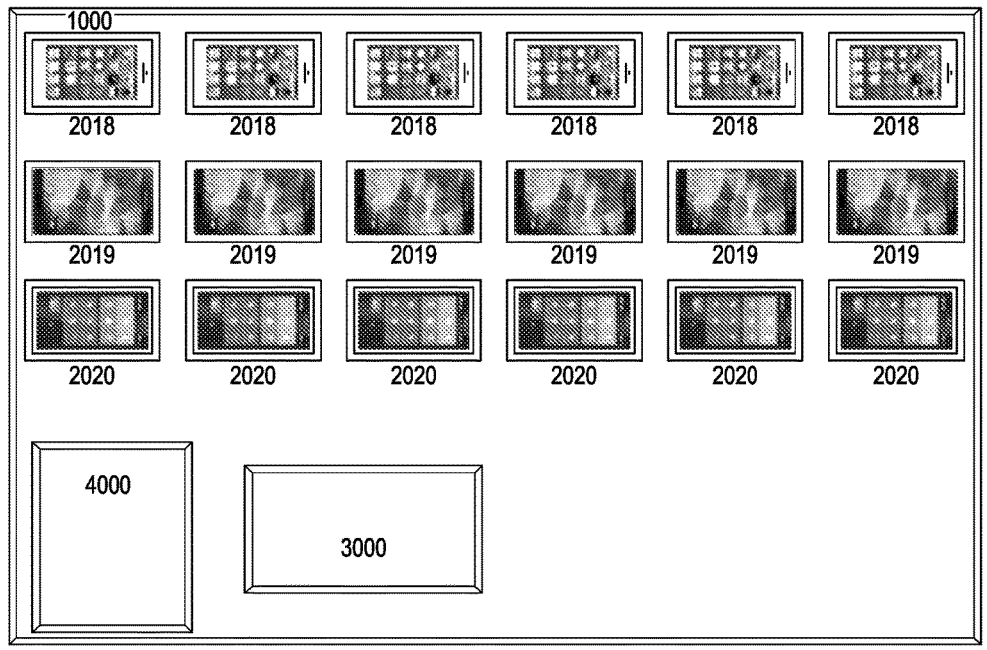
FIG. 13: Consumer electronic device bearing main board.

Thus to address this we use a main board as shown in the embodiment of FIG. 13: within the Main Board 1000 the "Sensor Boards" 200X are mobile phones set out in rows according to operating system i.e. a different operating system per row. The mobile phones are connected into the main board 1000 by a JTAG interface or connection serial wire. In this example, an iPhone 2018, Samsung 2019, Nokia 2020 are shown by way of illustration. In operation the Backup Board 4000 programs the iPhone 2018, Samsung 2019 and Nokia 2020.

The process begins with Backup Board 4000 instructing the first row of iPhone 2018 mobile phones to begin downloading the desired software, such as security software, an email system and other applications. Following programming completion, the first row of mobile phones may then be configured with the same customised software and applications. Next, Backup Board 4000 instructs the second row of (here Samsung 2019) mobile phones to begin downloading the desired software, such as security software, an email system and other applications. Following programming completion, the second row of mobile phones will each be configured with the same customised software and applications; the second row will also be configured with the same customised software and applications as was downloaded by the first row iPhone 2018 mobile phones, despite the fact that they use different operating systems. The Backup Board then instructs the third row of Nokia 2020 mobile phones to begin downloading the desired software. This process continues on a row-by-row basis until all devices have been programmed.

Alternatively, the Backup Board 4000 instructs all rows of mobile phones to simultaneously download the same software and configurations. Thus the iPhone 2018, Samsung 2019 and Nokia 2020 may download the same security software, the same email system and achieve substantially the same configuration at once, without the need to perform this function individually on a device by device basis.

Scenario 2

In Scenario 2, different types of technology, such as different types of mobile phone, a laptop and and/or laptops and/or tablets, are to be programmed with the same software for use within a company. These devices are not configured in the same manner because they are different types of technology and they use differing operating systems. Thus the same versions of software and applications cannot be installed simultaneously on all of the devices. Instead, each device must be individually programmed with the particular version of software that is compatible with that particular operating system. This makes programming the devices according to company and employee requirements time-consuming, as each device must be individually configured according to the operating system it uses (and different licenses are required for different devices).

Embodiments of the invention address this problem as they can program the devices, sequentially or simultaneously, by type and/or operating system, allowing each device to download the software appropriate to its operating system, thereby achieving application software uniformity across the devices. On the Main Board 1000, the "Sensor Boards" 200x are set out in rows according to sensor type, with each row being a different sensor type. Backup Board 4000 instructs the Sensor Boards 200x, either sequentially by row or some or all at once, to download software. The devices are programmed to download software compatible with their individual operating systems, thus saving time and achieving uniformity in the download of the same software across the rows of boards.

The skilled person will appreciate the previously described "sensor boards" may be replaced by boards of various other device types. For example, in one example embodiment, the Main Board 1000 carries one or more of: Nokia™ 2020 mobile phones, HP 2021 laptops, iPad™ 2022 tablets and iPhone™ 2018 mobile phones. These are set out in rows according to device type and connected to Backup Board 4000 by a JTAG interface and/or serial wire. The Backup Board initialises the first row of Nokia 2020 mobile phones to download security software, an email system and an application. After this completes, Backup Board 4000 initialises second row of, say, HP™ laptops 2021 to download the same security software, email system and application as the first row of Nokia 2020 mobile phones, but appropriate to their own operating systems. Once this is accomplished, Backup Board 4000 instructs the third row of, say, iPad™ tablets 2022 to download the applications and so forth, until all devices are programmed with (functionally) the same security software, email systems and applications.

Alternatively, the Backup Board 4000 may instruct some or all rows devices to simultaneously download the same software and configured to their operating systems. Thus in the preceding example the Nokia 2020 mobile phones, the HP 2021 laptops, the iPad 2022 tablets and the iPhone 2018 mobile phones may download the same security software, the same email system and achieve the same effective configuration in parallel, without the need to perform this function individually on a device by device basis.

Scenario 3

In this scenario RFID chips are added to mobile phones and tablets for the purposes of employee identification allowing, say, access to company premises at doors, elevators and gates and, for example, for use at vending machines or checkouts where they may be used to debit an employee's cash account when purchasing goods or services.

In this example, on the Main Board 1000, the Sensor Boards 200$x$ may comprise or consist of RFID chips or devices. The RFID chips or devices may be uniformly programmed as well as personalised per device where required. With programmed and personalised RFID chips or devices employees may, for example, have personal identification information such as biometric information pre-installed ready for identification purposes. Similarly electronic funds (cash) may be pre-installed on such or other devices.

Scenario 4

In this example scenario the sensors are used to assess and monitor the activity and performance of the different muscles and body parts of the athletes. For example a team coach may configure sensors for each of the players on the team. For instance a team coach may wish wants to see the activity of the players' muscles or organs such as heart, lungs, thighs, biceps, chest and/or knees. The coach may wish the entire team to have at least a minimum performance standard, and where there are injured players, may wish to monitor those players' performance while they recover. The Backup Board 4000 may, for example, program the sensor boards 200$x$ with the team's acceptable performance range. Additionally, each player may have their personalised information programmed into their sensors, which may, for example, be mounted on their clothes. This can allow, for example, a coach to monitor which players perform within the acceptable team-wide performance range; and/or which players perform within position specific performance ranges; and/or how players are performing based on historical measurements. Optionally the coach may also be able to examine how the players perform in comparison to each other. This can allow the team to refine training methods and produce personalised programs for each player to enhance sports performance. Such a system may, for example, allow a coach to identify performance weaknesses in certain areas of each player's body that may indicate whether an injury has occurred or is in danger of occurring, thus allowing remedial action to be taken.

Scenario 5

In this scenario the sensors are used to monitor patient location and/or health indicators in a hospital. When patients check in to the hospital, they receive a tag containing the technology already configured to communicate with sensors deployed throughout the hospital, programmed in accordance with embodiments of the invention. The tag may communicate with sensors throughout the building to identify the patient's location in the hospital. Additionally or alternatively a tag may be programmed with identifiers such as the patient's identity, health history, medication required and so forth. Further information monitored during the patient's stay such as vital signs, nurse and doctor visits, and/or medication given may be stored onto the tag in use. Thus sensors programmed in accordance with embodiments of the invention can allow hospitals to provide more accurate, efficient and complete care to patients.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of manufacturing a plurality of electronic devices, the method comprising:
   manufacturing a multi-device motherboard, the multi-device motherboard comprising:
   a plurality of programmable device circuit boards, each of said device circuit boards bearing an electronic device comprising at least a device processor and programmable, non-volatile device memory for storing code for controlling the device processor, and
   a device programming region, wherein each of the device circuit boards is detachable from the remainder of the motherboard except for one or more frangible links, at least one of said frangible links comprising a programming connection to the programmable circuit board;
   wherein the device programming region and device circuit boards are all part of the same circuit board, and wherein the device programming region bears a motherboard processor and motherboard program memory storing processor control code for controlling the motherboard processor to program the device circuit boards;
   storing code for at least one application program for said electronic device in said motherboard program memory;
   providing a user interface for said multi-device motherboard, wherein said user interface comprises a physical interface for an external computer system and a software user interface, wherein said software user interface is arranged to enable a user to configure each of said electronic devices to perform a defined function, wherein configuration of a said electronic device comprises providing software to said device memory of said electronic device, said software comprising code from said at least one application program such that a user-defined application is enabled to run on said electronic device to perform said user-defined function;
   using said user interface to configure said electronic devices on said motherboard; and
   detaching said configured electronic devices for use.

2. A method as claimed in claim 1 further comprising packaging a said configured electronic device after detaching the device.

3. A method as in claim 1 comprising configuring said devices in batches, in parallel, and detaching said devices one by one, as needed.

4. A method as claimed in claim 1 wherein said code in said motherboard program memory comprises source code, the method further comprising compiling a version of said stored code to perform said defined function.

5. A method as claimed in claim 1 further comprising storing a plurality of said application programs, and wherein said configuration comprises selecting a said application program for performing said defined function.

6. A method as claimed in claim 1 comprising downloading the program code in said device memory from said motherboard program memory.

7. A method as claimed in claim 1 wherein said motherboard processor and motherboard program memory are redundant after said electronic devices have been configured.

8. A method as claimed in claim 1 wherein said electronic device is a wireless sensor device including at least one sensor and a wireless transmitter, each coupled to said device processor.

9. A method as claimed in claim 1, wherein said detaching or removing of a device comprises fastening a case around a said device such that said fastening cuts one or more of said frangible links.

10. A method of fabricating a plurality of sensor devices, the method comprising:
fabricating a motherboard comprising a first, PCB (printed circuit board) array region and a second, device programming region, wherein said PCB array region comprises an array of individual device PCBs each with a layout for a sensor device, each having a frangible link to the motherboard such that said device PCBs and said device programming region form a panel;
fabricating sensor devices on said individual device PCBs and a programming device on said programming region;
operating said programming device whilst on said panel to program said sensor devices whilst said sensor devices are on said panel; and
removing said sensor devices from said panel.

11. A method as claimed in claim 10 wherein said programming device provides a user interface for selecting functions to be performed by said sensor devices, the method further comprising using said user interface of said programming device to select software for said devices such that different selected devices on said panel are programmed with different software.

12. A method of fabricating an electronic device, the method comprising:
fabricating a motherboard comprising an array of electronic devices each on a respective region of the motherboard isolated from the motherboard except for one or more frangible links; and
detaching an electronic device from said motherboard by fastening a case around the electronic device such that edges of the case cut said one or more frangible links; and
wherein each frangible link carries a programming connection for the electronic device.

13. A method as claimed in claim 12 wherein each electronic device has two frangible links, and wherein said electronic devices are daisy chained by said programming connections.

14. A method of manufacturing a plurality of electronic devices, the method comprising:
providing a motherboard comprising a first, PCB (printed circuit board) array region, wherein said PCB array region defines an array of individual device PCBs each for an electronic device, each having a frangible link to the motherboard;
providing a plurality of electronic devices on said individual device PCBs;
providing said motherboard with a second, device programming region, providing a programming system for said device programming region;
providing said programming system at least partly on said device programming region, such that said device PCBs and said device programming region form a PCB panel;
operating said programming system to program said electronic devices, whilst said electronic devices are on said motherboard, with one or more of: operating system software, application software, and configuration data for the devices; and
removing said electronic devices from said motherboard.

15. A method as claimed in claim 14 further comprising configuring a plurality of said devices for a plurality of different, specific individual end users whilst said devices are on said motherboard.

16. A method as claimed in claim 14 wherein at least some of said electronic devices comprise the same type of device, and wherein said programming comprises programming different devices or groups of said devices with different configuration data for a plurality of different, specific individual end users whilst said devices are on said motherboard.

17. A method as claimed in claim 14 wherein at least some of said electronic devices comprise different types of electronic devices and wherein said programming comprises programming said different types of electronic devices or groups of said different types of said electronic devices with different operating system software and/or different application software to perform substantially the same function on said different types of devices.

18. A method as claimed in claim 17 further comprising configuring said different application software with configuration data for a common user or common owner of said different types of electronic devices.

* * * * *